United States Patent
Zhou et al.

(10) Patent No.: US 6,365,508 B1
(45) Date of Patent: Apr. 2, 2002

(54) PROCESS WITHOUT POST-ETCH CLEANING-CONVERTING POLYMER AND BY-PRODUCTS INTO AN INERT LAYER

(75) Inventors: Mei Sheng Zhou; John Sudijono; Subhash Gupta; Sudipto Roy; Paul Ho; Xu Yi; Simon Chooi; Yakub Aliyu, all of Singapore (SG)

(73) Assignee: Chartered Semiconductor Manufacturing Ltd., Singaporae (SG)

( * ) Notice: Subject to any disclaimer, the term of this patent is extended or adjusted under 35 U.S.C. 154(b) by 0 days.

(21) Appl. No.: 09/618,264

(22) Filed: Jul. 18, 2000

(51) Int. Cl.⁷ .......................................... H01L 21/4763
(52) U.S. Cl. ...................... 438/627; 438/684; 438/789
(58) Field of Search .............................. 438/623, 626, 438/627, 637, 644, 789, 790, 793, 794

(56) References Cited

U.S. PATENT DOCUMENTS

| | | | | |
|---|---|---|---|---|
| 5,447,598 A | * | 9/1995 | Mihara et al. ................. 216/46 |
| 5,533,635 A | * | 7/1996 | Man ............................. 216/67 |
| 5,780,363 A | * | 7/1998 | Delehanty et al. ........... 438/748 |
| 5,824,234 A |   | 10/1998 | Jou et al. ...................... 216/18 |
| 5,930,664 A | * | 7/1999 | Hsu et al. .................... 438/612 |
| 5,970,373 A |   | 10/1999 | Allen ........................... 438/624 |
| 5,985,762 A |   | 11/1999 | Geffken et al. ............... 438/687 |
| 6,110,648 A | * | 8/2000 | Jang ............................. 430/312 |
| 6,127,089 A | * | 10/2000 | Subramanian et al. ....... 430/270 |
| 6,207,583 B1 | * | 3/2001 | Dunne et al. ................. 438/725 |
| 6,211,061 B1 | * | 4/2001 | Chen et al. ................... 438/622 |
| 6,222,269 B1 | * | 4/2001 | Usami .......................... 257/758 |
| 6,265,321 B1 | * | 7/2001 | Chooi et al. ................. 438/725 |
| 6,277,728 B1 | * | 8/2001 | Ahn et al. .................... 438/619 |
| 6,284,379 B1 | * | 9/2001 | Matsukura et al. .......... 428/421 |

\* cited by examiner

*Primary Examiner*—Long Pham
*Assistant Examiner*—William David Coleman
(74) *Attorney, Agent, or Firm*—George O. Saile; Rosemary L. S. Pike

(57) ABSTRACT

A new method to avoid post-etch cleaning in a metallization process is described. An insulating layer is formed over a first metal line in a dielectric layer overlying a semiconductor substrate. A via opening is etched through the insulating layer to the first metal line whereby a polymer forms on sidewalls of the via opening. The polymer is treated with a fluorinating agent whereby the polymer is converted to an inert layer. Thereafter, a second metal line is formed within the via opening wherein the inert layer acts is as a barrier layer to complete the metallization process in the fabrication of an integrated circuit device.

20 Claims, 3 Drawing Sheets

PROCESS WITHOUT POST-ETCH CLEANING-CONVERTING POLYMER AND BY-PRODUCTS INTO AN INERT LAYER

BACKGROUND OF THE INVENTION

(1) Field of the Invention

The invention relates to a method of metallization in the fabrication of integrated circuits, and more particularly, to a method avoiding post-etch cleaning of vias and trenches by converting etch residue to an inert layer in the manufacture of integrated circuits.

(2) Description of the Prior Art

As device geometry shrinks, it becomes more and more difficult to remove the post-etch polymer from deep submicron vias and trenches. The residue remaining in vias and trenches will affect the subsequent barrier deposition and metallization causing via poisoning, high contact/line resistance, and reliability issues. The small geometry vias and trenches also cause difficulty in metallization because too thin a barrier may lead to leakage and copper diffusion while too thick a barrier may cause a problem in gap-filling. In the case of organic low dielectric constant or porous low dielectric constant material's being used as dielectric materials, the post-etch cleaning (polymer and copper) is a challenge for both wet and dry cleaning processes. It would be desirable to avoid the necessity for cleaning the post-etch residue from deep submicron vias and trenches and, at the same time, provide a more robust diffusion barrier.

U.S. Pat. No. 5,824,234 to Jou et al teaches a method of removing a fluorocarbon polymer from a via. U.S. Pat. No. 5,970,373 to Allen shows a method of removing a polymer within an opening. U.S. Pat. No. 5,985,762 to Geffken et al describes a barrier layer on the sidewalls of a via. The barrier layer may comprise silicon nitride or a metal or metal nitride.

SUMMARY OF THE INVENTION

A principal object of the present invention is to provide an effective and very manufacturable method of metallization without requiring post-etch cleaning in the fabrication of integrated circuit devices.

Another object of the invention is to provide a dual damascene copper metallization process without post-etch cleaning in the fabrication of an integrated circuit device.

Yet another object of the invention is to provide a dual damascene copper metallization process without post-etch cleaning wherein etch residue is converted to an inert layer.

A further object of the invention is to provide a dual damascene copper metallization process without post-etch cleaning wherein etch residue is exposed to a fluorinating agent and converted to an inert layer.

In accordance with the objects of this invention a new method to avoid post-etch cleaning in a metallization process is achieved. An insulating layer is formed over a first metal line in a dielectric layer overlying a semiconductor substrate. A via opening is etched through the insulating layer to the first metal line whereby a polymer forms on sidewalls of the via opening. The polymer is treated with a fluorinating agent whereby the polymer is converted to an inert layer. Thereafter, a second metal line is formed within the via opening wherein the inert layer acts as a barrier layer to complete the metallization process in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention provides a metallization method where post-etch cleaning is avoided. The etch residue is exposed to a fluorinating agent and thereby converted to an inert layer which can remain within the via opening. The process of the present invention is illustrated in the following FIGS. 1 through 6 using a dual damascene copper metallization process. It will be understood by those skilled in the art that the process of the present invention should not be limited to the application illustrated in the figures, but may be applied and extended in any application in which a post-etch polymer is generated.

Figure 1:
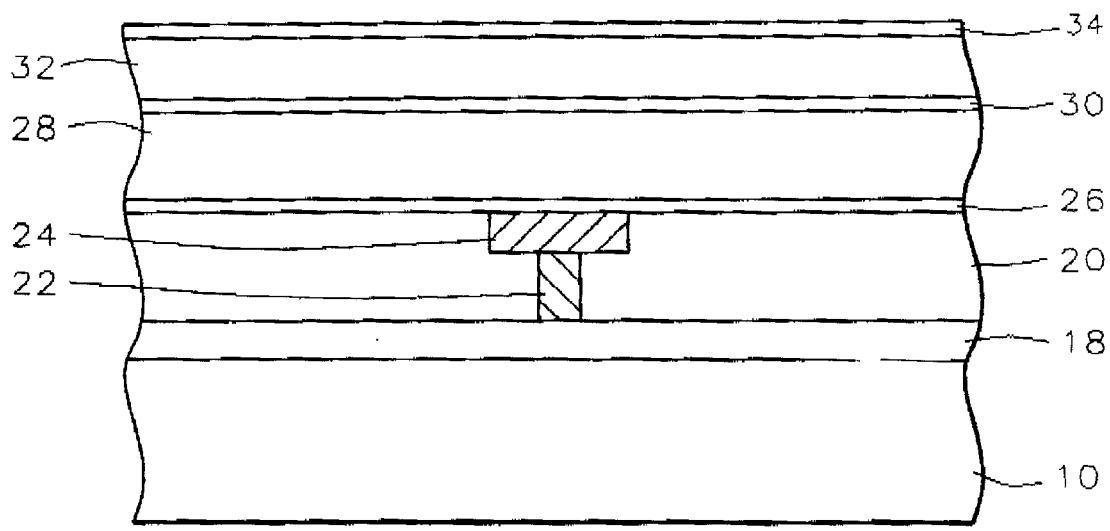
FIGS. 1 through 6 schematically illustrate in cross-sectional representation a process of the present invention.

Referring now more particularly to FIG. 1, there is illustrated a portion of a partially completed integrated circuit device. There is shown a semiconductor substrate 10, preferably composed of monocrystalline silicon. An intermetal dielectric (IMD) or interlevel dielectric (ILD) layer 18 is deposited on the substrate wafer. Semiconductor devices structures, such as gate electrodes, source and drain regions, or metal interconnects, not shown, may be formed in and on the semiconductor substrate and covered by the IMD or ILD layer 18.

For example, a tungsten plug 22 and overlying copper line 24 may be formed in openings through a second ILD layer 20, as shown. A passivation layer 26, typically silicon nitride, is formed over the copper line 24.

Further dielectric layers 28 and 32, optional etch stop layer 30, and optional cap layer 34 are formed as is conventional in the art.

Figure 2:
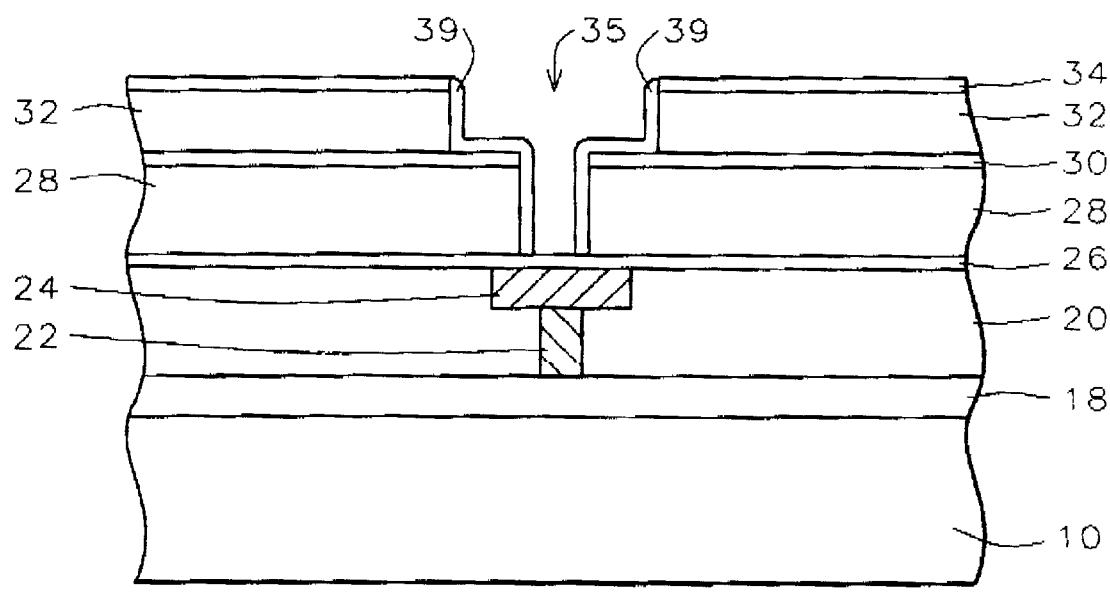

Referring now to FIG. 2, a dual damascene opening 35 is patterned into the dielectric layers 28 and 32. The patterning may be done by any conventional method, including via first, trench first, or embedded via. The etching stops at the passivation layer 26.

A post-etch polymer 39 forms on the sidewalls of the opening 35. The post-etch polymer contains mainly carbon, fluorine, oxygen, and silicon. The polymer composition depends upon the etch chemistry and the dielectric materials. The etch chemistry usually contributes carbon, fluorine, and oxygen. Silicon oxide dielectric materials provide silicon and oxygen. Other low dielectric constant dielectric materials will provide other polymer components, depending upon the composition of these materials.

In the prior art, a post-etch cleaning step would now be employed to remove the post-etch polymer 39 from the via opening. However, as noted above, this removal is difficult especially in deep submicron vias and trenches. The process of the present invention eliminates the necessity of removing this post-etch polymer.

Figure 3:
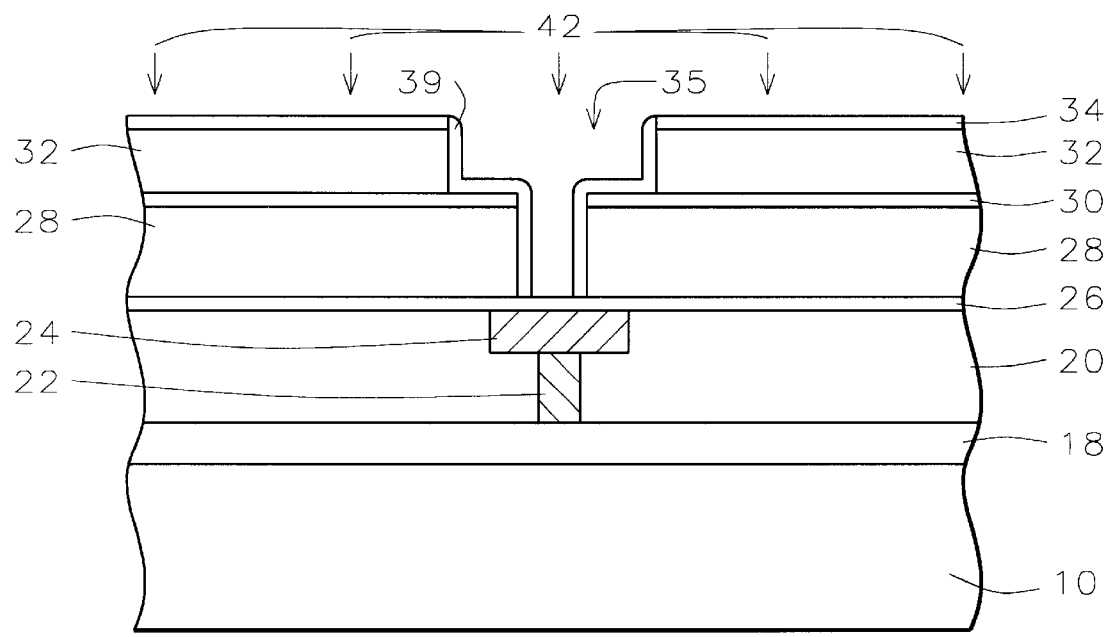
Figure 4:
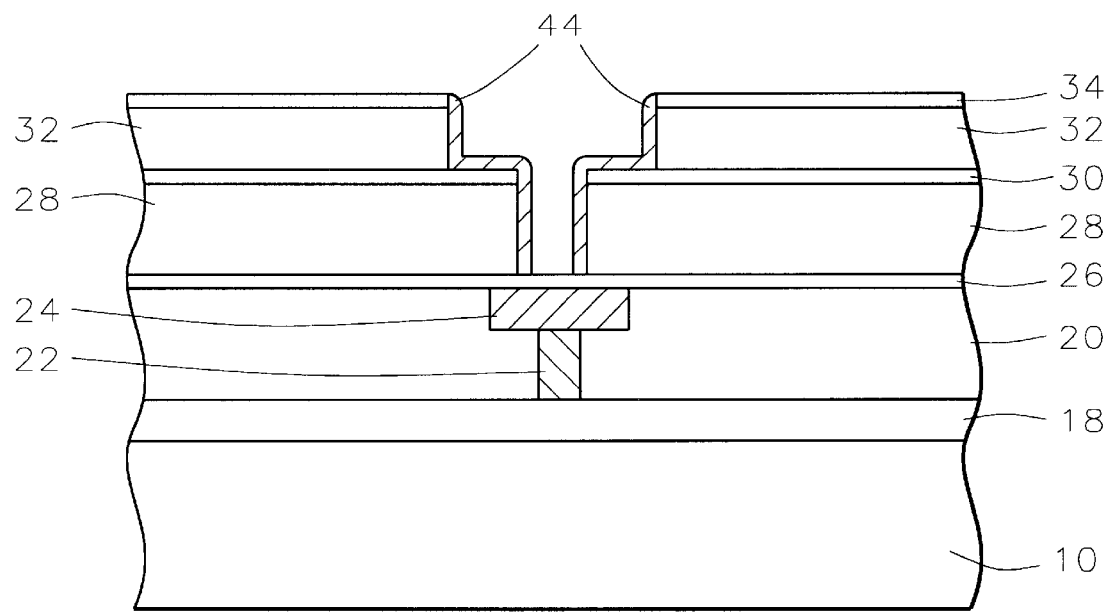

As illustrated in FIG. 3, the polymer is treated with a fluorinating agent 42. The fluorinating agent can be, but is not limited to, $F_2$. Other possible fluorinating agents are fluorinated alkanes such as $CHF_3$, $CH_2F_2$, $CHF_3$, $CF_4$, etc., fluorinated alkenes such as $CH_2CHF$, $C_2F_4$, etc., and other fluorinated organic compounds. The fluorinating agent reacts with the polymer and by-products to form a "Teflon-like" polymeric 44, shown in FIG. 4.

The process conditions for the treatment can be similar to a conventional plasma enhanced chemical vapor deposition (PECVD) process. The reagent for the PECVD process can be fluorine alone, or a mixture of fluorinated carbons, fluorine, and unsaturated hydrocarbons. Examples of unsaturated hydrocarbons include acetylene, alkene, fluoroalkene, and fluoroacetylene.

The "teflon-like" polymeric 44 is an inert layer. It provides a thin, useful copper barrier with low dielectric constant. Using the process of the present invention, post-etch cleaning has been eliminated. At the same time, barrier metal thickness can be minimized. Increasing the treatment time increases the thickness of the inert layer 44. If the inert layer 44 is thick enough, it can totally replace the barrier metal layer.

Figure 5:
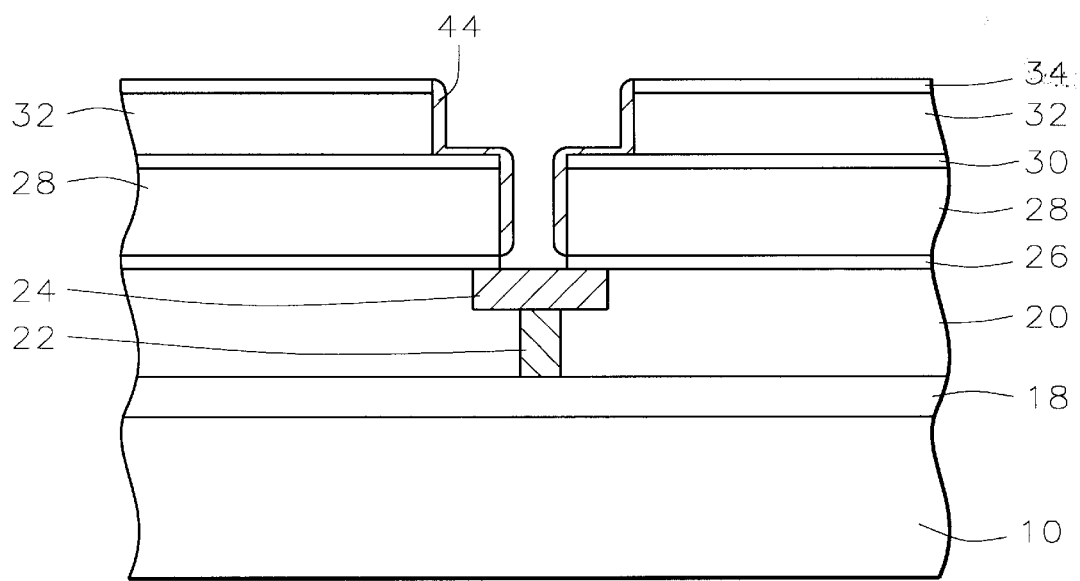
Figure 6:
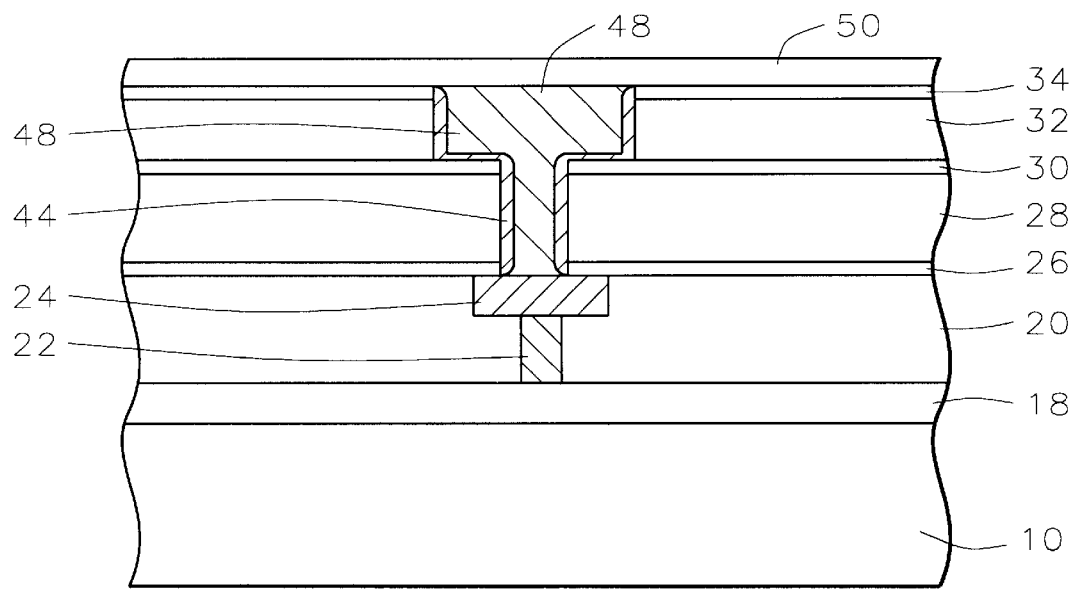

Now, referring to FIG. 5, the passivation layer 26 is etched through to expose the underlying copper line. During the etching of the passivation layer 26, part of the inert layer 44 at the bottom of the trench will be removed. Thus, the etch stop layer 30 can be used as part of the buffer/barrier layer for the integrated structure.

Now, a copper layer 48 is formed within the opening by any of the conventional means, including physical or chemical vapor deposition, electrochemical plating (ECP), or electroless plating, and so on. The excess copper layer is polished off by chemical mechanical polishing (CMP), for example.

Processing continues as conventional in the art with further levels of metallization, if required. Passivation layer 50 completes the integrated circuit device.

The process of the present invention provides a method for converting the post-etch polymer into a useful thin layer which is left on the sidewalls of the via and trench openings. The present invention allows the elimination of post-etch cleaning, minimization or elimination of the barrier metal layer, and reduction of effective dielectric constant value.

While the invention has been particularly shown and described with reference to the preferred embodiments thereof, it will be understood by those skilled in the art that various changes in form and details may be made without departing from the spirit and scope of the invention.

What is claimed is:

1. A method of metallization in the fabrication of an integrated circuit device comprising:

forming an insulating layer over a first metal line in a dielectric layer overlying a semiconductor substrate;

etching a via through said insulating layer to said first metal line whereby a polymer forms on sidewalls of said via opening;

treating said polymer with a fluorinating agent whereby said polymer is converted to an inert layer; and thereafter forming a second metal line within said via opening wherein said inert layer acts as a barrier layer to complete said metallization in the fabrication of said integrated circuit device.

2. The method according to claim 1 wherein said first metal line comprises copper.

3. The method according to claim 1 wherein said insulating layer comprises multiple layers of dielectric materials.

4. The method according to claim 1 wherein said via is a dual damascene opening.

5. The method according to claim 1 wherein said polymer comprises carbon, fluorine, oxygen, and silicon.

6. The method according to claim 1 wherein said step of treating said polymer comprises a plasma enhanced chemical vapor deposition process.

7. The method according to claim 1 wherein said fluorinating agent comprises one of the group containing $F_2$, fluorocarbons, fluorinated alkanes, and fluorinated alkenes.

8. The method according to claim 1 wherein said inert layer comprises a "teflon-like" polymeric.

9. The method according to claim 1 wherein said second metal line comprises copper.

10. A method of dual damascene copper metallization in the fabrication of an integrated circuit device comprising:

forming a passivation layer over a first copper line in a dielectric layer overlying a semiconductor substrate;

depositing a dielectric layer overlying said passivation layer;

etching a dual damascene opening through said dielectric layer to said first copper line wherein said passivation layer remains over said first copper line and whereby a polymer forms on sidewalls of said dual damascene opening;

treating said polymer with a fluorinating agent whereby said polymer is converted to an inert layer;

thereafter etching through said passivation layer to said first copper line; and filling said dual damascene opening with copper wherein said inert layer acts as a barrier layer to prevent copper diffusion to complete said metallization in the fabrication of said integrated circuit device.

11. The method according to claim 10 wherein said dielectric layer comprises multiple layers of dielectric materials.

12. The method according to claim 10 wherein said polymer comprises carbon, fluorine, oxygen, and silicon.

13. The method according to claim 10 wherein said step of treating said polymer comprises a plasma enhanced chemical vapor deposition process.

14. The method according to claim 10 wherein said fluorinating agent comprises one of the group containing $F_2$, fluorocarbons, fluorinated alkanes, and fluorinated alkenes.

15. The method according to claim 10 wherein said inert layer comprises a "teflon-like" polymeric.

16. A method of dual damascene copper metallization in the fabrication of an integrated circuit device comprising:

forming a passivation layer over a first copper line in a dielectric layer overlying a semiconductor substrate;

depositing a dielectric layer overlying said passivation layer;

etching a dual damascene opening through said dielectric layer to said first copper line wherein said passivation layer remains over said first copper line and whereby a polymer forms on sidewalls of said dual damascene opening;

treating said polymer with a fluorinating agent whereby said polymer is converted to a "teflon-like" polymeric layer;

thereafter etching through said passivation layer to said first copper line; and filling said dual damascene opening with copper wherein said "teflon-like" polymeric layer acts as a barrier layer to prevent copper diffusion to complete said metallization in the fabrication of said integrated circuit device.

17. The method according to claim 16 wherein said dielectric layer comprises multiple layers of dielectric materials.

18. The method according to claim 16 wherein said polymer comprises carbon, fluorine, oxygen, and silicon.

19. The method according to claim 16 wherein said step of treating said polymer comprises a plasma enhanced chemical vapor deposition process.

20. The method according to claim 16 wherein said fluorinating agent comprises one of the group containing $F_2$, fluorocarbons, fluorinated alkanes, and fluorinated alkenes.

* * * * *

UNITED STATES PATENT AND TRADEMARK OFFICE
CERTIFICATE OF CORRECTION

PATENT NO. : 6,365,508 B1
DATED : April 2, 2002
INVENTOR(S) : Mei Sheng Zhou et al.

It is certified that error appears in the above-identified patent and that said Letters Patent is hereby corrected as shown below:

<u>Title page,</u>
Item [75], Inventors, delete "Sudipto Roy" and replace it with -- Sudipto Ranendra Roy --.

Signed and Sealed this

Tenth Day of June, 2003

JAMES E. ROGAN
*Director of the United States Patent and Trademark Office*